United States Patent [19]

Kasukawa et al.

[11] Patent Number: 5,363,392
[45] Date of Patent: Nov. 8, 1994

[54] STRAINED QUANTUM WELL TYPE SEMICONDUCTOR LASER DEVICE

[75] Inventors: Akihiko Kasukawa, Tokyo; Toshio Kikuta, Fujisawa, both of Japan

[73] Assignee: The Furokawa Electric Co., Ltd., Tokyo, Japan

[21] Appl. No.: 978,234

[22] Filed: Nov. 18, 1992

[30] Foreign Application Priority Data

Nov. 18, 1991 [JP] Japan .................. 3-329517

[51] Int. Cl.⁵ .................................... H01S 3/19
[52] U.S. Cl. .................................... 372/45; 372/43
[58] Field of Search .................................... 372/43–50

[56] References Cited

U.S. PATENT DOCUMENTS

| | | | |
|---|---|---|---|
| 5,040,186 | 8/1991 | Logan et al. | 372/45 |
| 5,117,469 | 5/1992 | Cheung et al. | 372/45 X |
| 5,136,602 | 8/1992 | Sugawara | 372/45 |
| 5,155,737 | 10/1992 | Ikeda et al. | 372/43 |
| 5,251,224 | 10/1993 | Irikawa et al. | 372/45 |
| 5,251,225 | 10/1993 | Eglash et al. | 372/45 |

*Primary Examiner*—John D. Lee
*Attorney, Agent, or Firm*—Jacobson, Price, Holman & Stern

[57] ABSTRACT

A strained quantum well type semiconductor laser device is disclosed to comprise a plurality of layers including a quantum well active layer formed on a semiconductor substrate characterized in that tensile strained quantum well layers and compression strained barrier layers are stacked alternately to form said quantum well active layer and the quantum well layers are made of either InGaAs or InGaAsP and InP, when the semiconductor substrate is made of InP, InGaP or GaAs, respectively.

5 Claims, 2 Drawing Sheets

FIG. I
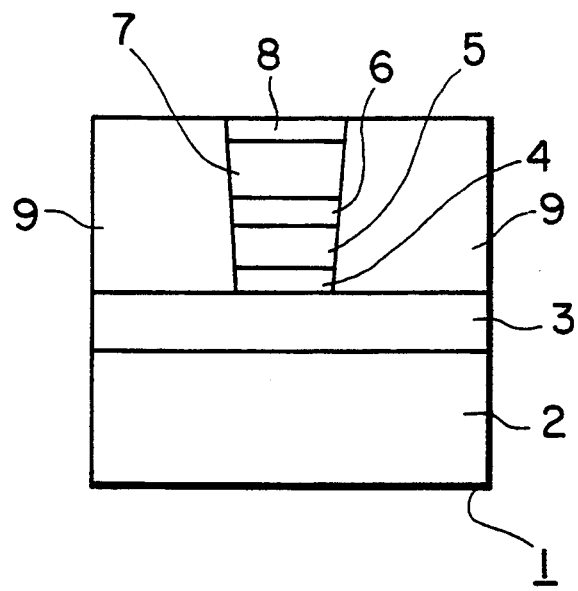
FIG. 2
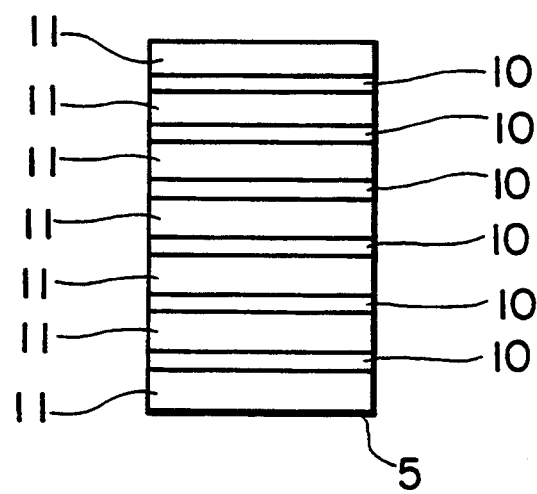

STRAINED QUANTUM WELL TYPE SEMICONDUCTOR LASER DEVICE

BACKGROUND OF THE INVENTION

1. Field of the Invention

This invention relates to a strained quantum well type semiconductor laser device to be used in the field of opto-electronics including optical telecommunication and data telecommunication.

2. Prior Art

Strained quantum well type semiconductor laser device comprising an active layer having a strained quantum well structure are categorized as compound semiconductor laser devices and massive studies are being currently carried out on them.

As is well known, a quantum well type semiconductor laser device comprises an active layer having a thickness as small as the wavelength of Broglie waves and a quantized level for electrons to take as a function of the well type potential of its width.

Such an active layer is required to have a thickness of approximately 100Å in order to show an excellent performance. Such a thin active layer can be prepared by means of a crystal growth method such as MOCVD or MBE.

In a strained quantum well type semiconductor laser device, the lattice constant of a quantum well layer and that of an adjacent barrier layer of its strained quantum well structure normally differ from each other by approximately 0.5 to 2%.

In a strained quantum well type semiconductor laser device as mentioned above, the in-plane hall effective mass in the valence band comes close to that of an electron in the conduction band and consequently the laser device can operate with a lower threshold current.

It is a proven fact that a strained quantum well type semiconductor laser device has a low threshold current for an oscillation wavelength of approximately 1 $\mu$m.

In view of this fact, there has been a strong demand for strained quantum well type semiconductor laser devices that operate similarly well at the lower threshold current for oscillation wavelength bands of not only 1.3 $\mu$m and 1.5 $\mu$m which are particularly important for optical telecommunication, but also 0.63 $\mu$m for optical disc application.

For the oscillation wavelength band of 1.5 $\mu$m, a strained quantum well type semiconductor laser device comprising quantum well layers made of compressively strained InGaAs and barrier layers made of strain-compensated InGaAsP has been proposed.

FIG. 3 of the accompanying drawings illustrates such a strained quantum well type semiconductor laser device which is generally denoted by reference number 12 and comprises an n-InP buffer layer 14, a nondoped InGaAsP optical waveguide layer 15, a quantum well active layer 16, a nondoped InGaAsP optical waveguide layer 17, a p-InP clad layer and a p-InGaAsP contact layer 19 are sequentially formed in the above mentioned order on an n-InP semiconductor substrate 13 by a crystal growth method (including an epitaxial growth method) such as MOCVD or MBE.

Referring to FIG. 4, the quantum well active layer 16 comprises a number of compressively strained InGaAs quantum well layers 20 and strain compensated InGaAsP barrier layers 21 stacked alternately to produce a multilayered quantum well structure.

Each of the optical waveguide layers 15 and 17 have an energy band gap wavelength of 1.3 $\mu$m.

The amount of strain in the well 20 is 1.8% in compression corresponding to x=0.8.

If the thickness of each of the compressively strained layers (InGaAs quantum well layers 20) exceeds 20Å, it becomes impossible to obtain $\lambda$=1.5 $\mu$m.

For an optical semiconductor device comprising compression strained InGaAs quantum well layers 20 and having $\lambda$=1.5 $\mu$m, each of the quantum well layers 20 cannot have a thickness thicker than 20Å under the condition of x=0.8.

The quantum well layers 20 of a strained quantum well type semiconductor laser device 12 prepared under such restrictive conditions by turn inevitably have to have a high threshold carrier density due to the thin well thickness.

While a strained quantum well type semiconductor laser device 12 having a configuration as described above may be made to operate highly efficiently with a lower threshold current at room temperature, it may not satisfy the requirements of operation of a lower threshold current, a high efficiency and a high speed modulation at higher temperature because the Auger recombination and intervalence electron absorption of such a device that determines its performance at various temperature levels largely depends on the carrier density of the quantum well layers 20.

Additionally, since each thickness of the quantum well layers 20 needs to be controlled to be 20Å, the process of producing such layers requires a high degree of process control.

In view of the technological problems as described above, it is, therefore, an object of the present invention to provide a strained quantum well type semiconductor laser device that can be manufactured without any difficulties and operates satisfactorily at high temperature.

SUMMARY OF THE INVENTION

According to the present invention, the above object is achieved by providing a strained quantum well type semiconductor laser device comprising a plurality of layers including a quantum well active layer formed on a semiconductor substrate characterized in that quantum well layers having a tensile strain and compressively strained barrier layers are stacked alternately to form said quantum well active layer.

The semiconductor substrate mentioned above may be made of either InP or GaAs.

In the above composition, when the semiconductor substrate is made of InP, the quantum well layers are made of InGaAs or InGaAsP, and when the semiconductor substrate is made of GaAs, the quantum well layers are made of GaInP.

Further in the above composition, when the semiconductor substrate is made of InP, the barrier layers are made of either InGaAsP or AlGaInAs, and when the semiconductor substrate is made of GaAs, the barrier layers are made of AlGaInP.

With regard to these quantum well layers and barrier layers, the thicknesses of the quantum well layers and the barrier layers are set to 25 to 200Å and 30 to 250Å, respectively.

As described above, of the quantum well layers and the barrier layers that constitute the quantum well active layer in a strained quantum well type semiconductor laser device according to the invention, the former consist of tensile strain and the latter consist of compressive strain so that the device has lower threshold carrier density resulting in less influential of the Auger recombination and intervalence band absorption. Consequently, the device can operate with a lower threshold current, high quantum efficiency and high speed modulation.

Additionally, since the quantum well layers of a strained quantum well type semiconductor laser device according to the invention has a tensile strain, the oscillation wavelength of the device is not shifted to the longer wavelength if the thickness of each of the quantum well layers exceeds 20Å and, therefore, the process of manufacturing such a device does not require a rigorous process control.

BRIEF DESCRIPTION OF THE DRAWINGS

FIG. 1 is a schematic sectional view of a preferred embodiment of strained quantum well type semiconductor laser device according to the invention.

FIG. 2 is an enlarged partial view of the embodiment of FIG. 1.

DETAILED DESCRIPTION OF THE INVENTION

Figure 3:
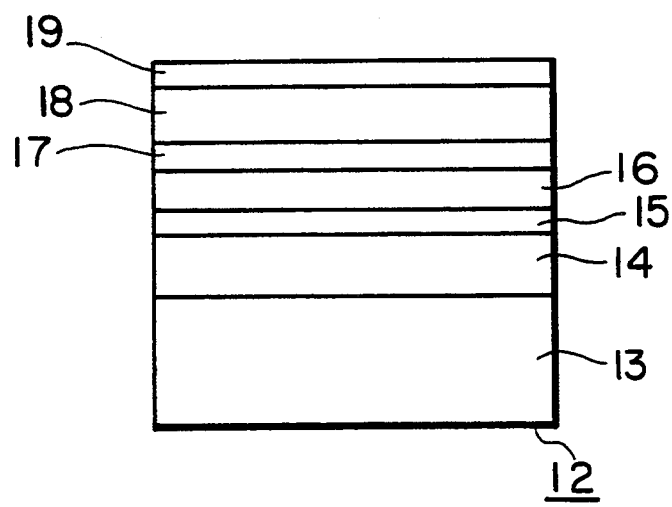
FIG. 3 is a schematic sectional view of a conventional strained quantum well type semiconductor laser device.
Figure 4:
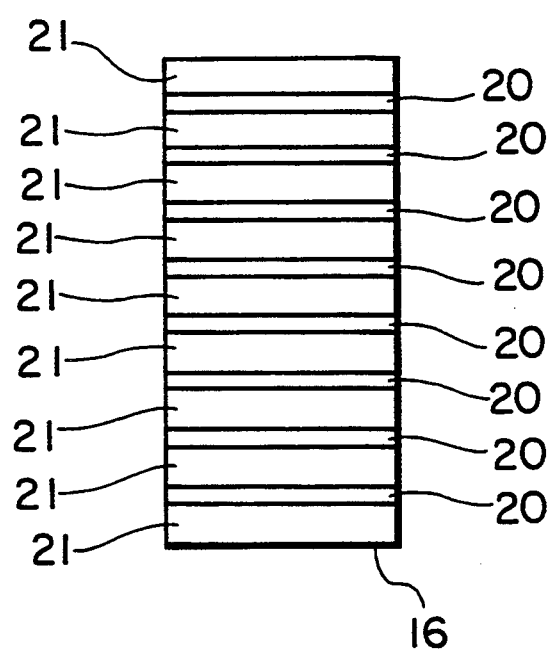
FIG. 4 is an enlarged partial view of the device of FIG. 3.

Now, the present invention will be described in greater detail by referring to the accompanying drawings that illustrate a preferred embodiment of the invention.

FIG. 1 shows a schematic sectional view of a preferred embodiment of strained quantum well type semiconductor laser device 1 according to the invention.

The strained quantum well type semiconductor laser device 1 illustrated in FIG. 1 comprises an n-InP buffer layer 3, a nondoped InGaAsP optical waveguide layer 4, a quantum well active layer 5, a nondoped InGaAsP optical waveguide layer 6, a p-InP clad layer 7, a p-InGaAsP contact layer 8 and a Fe-doped semiinsulated buried layer are sequentially formed in layers on an n-InP semiconductor substrate 2 by means of an epitaxial growth method such as MOCVD method and shows a buried type heterostructure.

As illustrated in FIG. 2, the quantum well active layer 5 is in fact a multilayered quantum well structure comprising six (6) (e.g.: x=0.38) quantum well layers (tensile strain layers) 10 made of $In_xGa_{1-x}As$ and six (6) barrier layers (compressive strain layers) 11 made of InGaAsP that are stacked alternately.

The two nondoped InGaAsP optical waveguide layers 4 and 6 may, for instance, have an energy band gap wavelength of 1.3 μm.

For instance, each of the n-InP buffer layer 3 and the two nondoped InGaAsP optical waveguide layers 4 and 6 may have a thickness of 1,000Å, while the p-InGaAsP contact layer 8 and the Fe-doped semiinsulated buried layer 9 may respectively have thickness of 0.5 μm and 3 μm. Each of t he quantum well layers 10 may have a thickness of 150Å, while each of the barrier layers 11 may have a thickness of 150Å.

The strained quantum well type semiconductor laser device 1 is provided on the upper and lower surfaces with a p-electrode and an n-electrode respectively by well known means.

When a strained quantum well type semiconductor laser device having a configuration as described above, where the quantum well active layer 5 had a finely striped cross section, was used in an experiment for a resonator having a length of 200 μm and a product of the reflectivities of the front and rear facets of 0.8 (95% for the rear and 84% for the front facets), it was possible to reduce the threshold electric current to 3 mA and raise the allowable maximum temperature for DC drive CW (Continuous Wave), respectively to above 150° C.

Although the overall thickness of the quantum well active layer 5 of the device 1 of this example exceeded the critical level, no crystal dislocation was observed because of the compressively strained barrier layers 11.

A strained quantum well type semiconductor laser device 1 according to the invention and having a configuration as described above can operate well at high temperature and by a lower threshold currency mainly due to the fact that the quantum well active layer 5 comprises a relatively thick quantum well layers 10 having a tensile strain and barrier layers 11 having a compressive strain, allowing the number of quantum well layers 10 to be increased to reduce the extent of Auger recombination that determines the performance of the device as a function of temperature.

Because of the above described improvements, strained quantum well type semiconductor laser device 1 according to the invention can highly efficiently operate with an enhanced capability of high speed modulation.

Additionally, as the overall thickness of the quantum well layers 10 of a strained quantum well type semiconductor laser device according to the invention can be made greater than that of their counterparts of a conventional device (approximately 20Å), it may well be less rigorously controlled in the process of manufacturing the device.

The thickness of each of the quantum well layers 10 and the barrier layers 11 and the ratio of the ingredients of the layers are not limited to those described above and may be modified appropriately as long as the quantum well layers 10 consist of tensile strain and the barrier layers 11 consist of compressive strain.

More specifically, each of the quantum well layers 10 may have a thickness between 25 and 200Å( while each of the barrier layers 11 may be made to show a thickness between 30 and 250Å.

The barrier layers 11 may alternatively be made of AlGaInAs and the nondoped InGaAsP optical waveguide layers 4 and 6 may alternatively have a GRIN-SCH structure in order to reduce the internal loss of resonator.

Alternatively, GaAs, InGaP and AlInGaP may be used for the substrates, the quantum well layer and the barrier layers, respectively.

As described above in detail, since a strained quantum well type semiconductor laser device according to the present invention is provided with a quantum well active layer comprising tensile strain quantum well layers and compressive strained barrier layers, it can reduce the extent of Auger recombination determines the performance of the device as a function of temperature so that it may operate with a lower threshold current, a high-speed modulation and a high efficiency at a high temperature.

Additionally, since the quantum well active layer of a strained quantum well type semiconductor laser device according to the present invention may be rather thick, it needs not be rigorously controlled in the process of manufacturing the device.

What is claimed is:

1. A strained quantum well type semiconductor laser device comprising a plurality of layers including a quantum well active layer formed on a semiconductor substrate, wherein each quantum well active layer comprises tensile strain quantum well layers and compressive strain barrier layers stacked alternately, wherein said quantum well layers are made of either InGaAs or InGaAsP and have a thickness between 100 and 200Å.

2. A strained quantum well type semiconductor laser device according to claim 1, wherein each of the barrier layers has a thickness between 30 and 250Å.

3. A strained quantum well type semiconductor laser device according to claim 1, wherein said quantum well layers are made of InGaAsP, and the semiconductor substrate is made of GaAs.

4. A strained quantum well type semiconductor laser device according to claim 1, wherein the barrier layers are made of GaInAsP, AlGaInAs, and have a thickness of 100 to 200Å and the semiconductor substrate is made of InP.

5. A strained quantum well type semiconductor laser device according to claim 1, wherein the barrier layers are made of AlGaInP, and have a thickness of 100 to 200Å and the semiconductor substrate is made of GaAs.

* * * * *